United States Patent
Wilson et al.

(10) Patent No.: US 6,180,495 B1
(45) Date of Patent: *Jan. 30, 2001

(54) SILICON CARBIDE TRANSISTOR AND METHOD THEREFOR

(75) Inventors: Syd R. Wilson, Phoenix; Charles E. Weitzel, Mesa; Mohit Bhatnagar, Chandler; Karen E. Moore, Phoenix; Thomas A. Wetteroth, Chandler, all of AZ (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/054,541

(22) Filed: Apr. 3, 1998

(51) Int. Cl.$^7$ ..................................... H01L 21/30
(52) U.S. Cl. .................. 438/455; 438/458; 438/459; 438/469; 438/931
(58) Field of Search .................. 438/931, 15, 625, 438/464, 455, 458, 459, 977

(56) References Cited

U.S. PATENT DOCUMENTS

| | | | |
|---|---|---|---|
| 3,571,919 | * | 3/1971 | Gleim et al. ................ 148/DIG. 148 |
| 4,757,028 | * | 7/1988 | Kondoh et al. ............. 148/DIG. 148 |
| 5,057,889 | * | 10/1991 | Yamada et al. .................... 257/353 |
| 5,101,242 | * | 3/1992 | Ikeda et al. ......................... 257/9 |
| 5,294,814 | * | 3/1994 | Das .................................... 257/77 |
| 5,374,564 | | 12/1994 | Bruel .................................. 438/455 |
| 5,382,822 | * | 1/1995 | Stein ................................. 257/410 |
| 5,559,043 | * | 9/1996 | Bruel ................................. 438/407 |
| 5,585,304 | * | 12/1996 | Hayashi et al. ............. 148/DIG. 148 |
| 5,597,744 | * | 1/1997 | Kamiyama et al. ........ 148/DIG. 148 |
| 5,641,695 | * | 6/1997 | Moore et al. ....................... 438/186 |
| 5,661,333 | * | 8/1997 | Bruel et al. ........................ 257/618 |
| 5,933,750 | * | 8/1999 | Wilson et al. ..................... 438/455 |

OTHER PUBLICATIONS

Cioccio et al. "Silicon Carbide on Insulator Formation Using the Smart Cut Process", Electronics Letters, vol. 32, pp. 1144–1145.*

* cited by examiner

*Primary Examiner*—Carl Whitehead, Jr.
*Assistant Examiner*—Maria Guerrero
(74) *Attorney, Agent, or Firm*—Robert F. Hightower

(57) ABSTRACT

A silicon carbide transistor (10) is formed from a silicon carbide film (14) that is formed on a silicon carbide substrate bulk (37). A conductor pattern layer (25) is formed on the silicon carbide film (14) and the silicon carbide film (14) removed from the silicon carbide substrate bulk (37) and attached to a substrate (11) of a dissimilar semiconductor material.

3 Claims, 1 Drawing Sheet

SILICON CARBIDE TRANSISTOR AND METHOD THEREFOR

BACKGROUND OF THE INVENTION

The present invention relates, in general, to semiconductor devices, and more particularly, to a novel silicon carbide transistor.

Silicon carbide transistors typically are formed on a silicon carbide substrate. Often, the source and drain areas are a series of alternating stripes that are formed into a top surface of a thick bulk single crystal silicon carbide substrate. A portion of such a prior art structure is shown in FIG. 1 wherein a transistor 100 is formed on a thick, typically greater than about three hundred microns, bulk single crystal silicon carbide substrate 101. Transistor 100 has a source 102 that is formed as a long rectangular stripe on the top surface of substrate 101. A drain 103 is also formed as a rectangular stripe on the top surface of substrate 101. A metal gate 104 is formed on the top surface between source 102 and drain 103. A drain electrode 107 is formed on top of drain 103 and is used to interconnect drain 103 to other drain areas on transistor 100. In order to connect source 102 to other source areas on transistor 100, a source electrode 106 is typically formed as an air-bridge extending from source 102 up into the air across gate 104 and drain electrode 107 to an adjacent source area. Such air-bridges are well known to those skilled in the art. Some disadvantages of such air-bridge structures are that they are difficult and expensive to fabricate, and such structures are unreliable. Additionally, such air-bridges result in excess source impedance thereby effecting the performance of transistor 100.

Accordingly, it is desirable to have a silicon carbide transistor that does not utilize air-bridges, that reduces manufacturing cost, and that minimizes source impedance of the transistor.

DETAILED DESCRIPTION OF THE DRAWINGS

Figure 1:
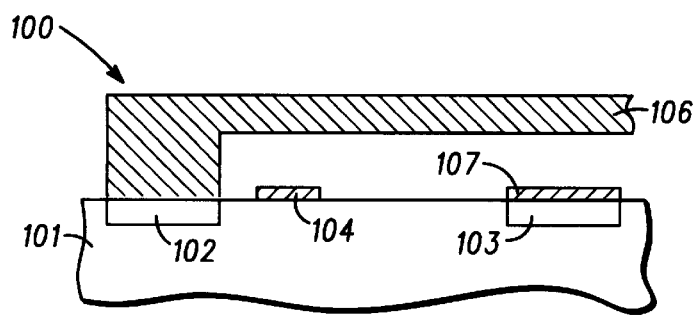
FIG. 1 schematically illustrates a cross-sectional view of a prior art silicon carbide transistor.
Figure 2:
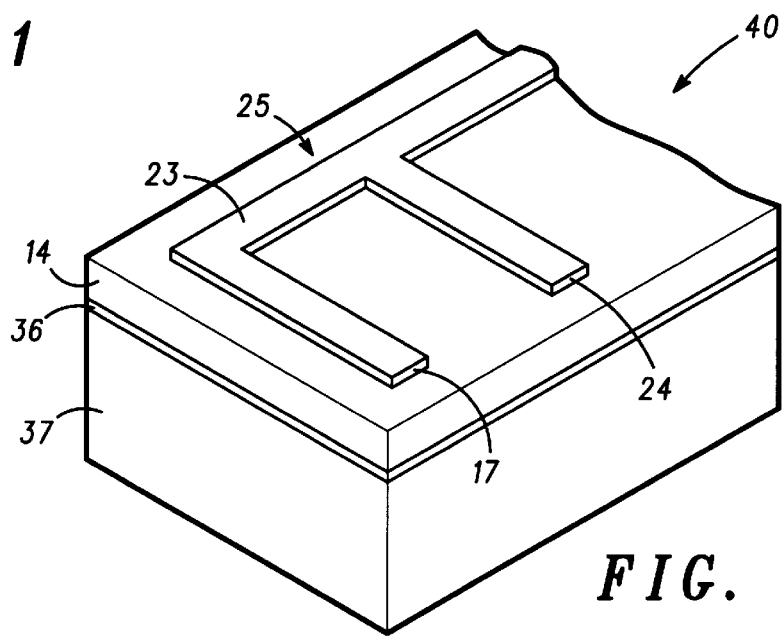
FIG. 2 schematically illustrates an isometric view of a portion of a silicon carbide substrate in accordance with the present invention.

FIG. 2 illustrates a portion of a thick bulk single crystal silicon carbide substrate 40 that is utilized to form a thin silicon carbide film 14 which will subsequently be used in the formation of a semiconductor device that includes a silicon carbide transistor. Prior to separating or cleaving film 14 from substrate 40, a conductor pattern layer 25 is formed on a top surface of substrate 40. Conductor pattern layer 25 will subsequently be utilized to form source contacts as will be seen hereinafter. Conductor pattern layer 25 typically is metal that is formed into a finger like pattern and includes a plurality of fingers which will form the source contacts. Conductor pattern layer 25 includes a finger or contact 17 and a finger or contact 24 along with a connecting conductor 23 that electrically connects contacts 17 and 24, and any other contacts on film 14 or substrate 40. The thickness of film 14 is chosen to achieve the frequency of operation and power dissipation desired for the transistor that will be formed by using film 14. Typically, film 14 is between ten nano-meters and four thousand nanometers in order to provide adequate high-frequency operation and high power dissipation. Thereafter, a dielectric layer 13 (see FIG. is formed on the surface of film 14 in order to form a planar surface with conducter pattern layer 25. Dielectric layer 13 does not cover contacts 17 and 24 or conductor 23. A hydrogen layer 36 is implanted within substrate 40 for future removal of film 14 as will be seen hereinafter. Other ions such as helium or mixtures of ions may also be used. Layer 36 can also be formed before forming layer 25.

Figure 3:
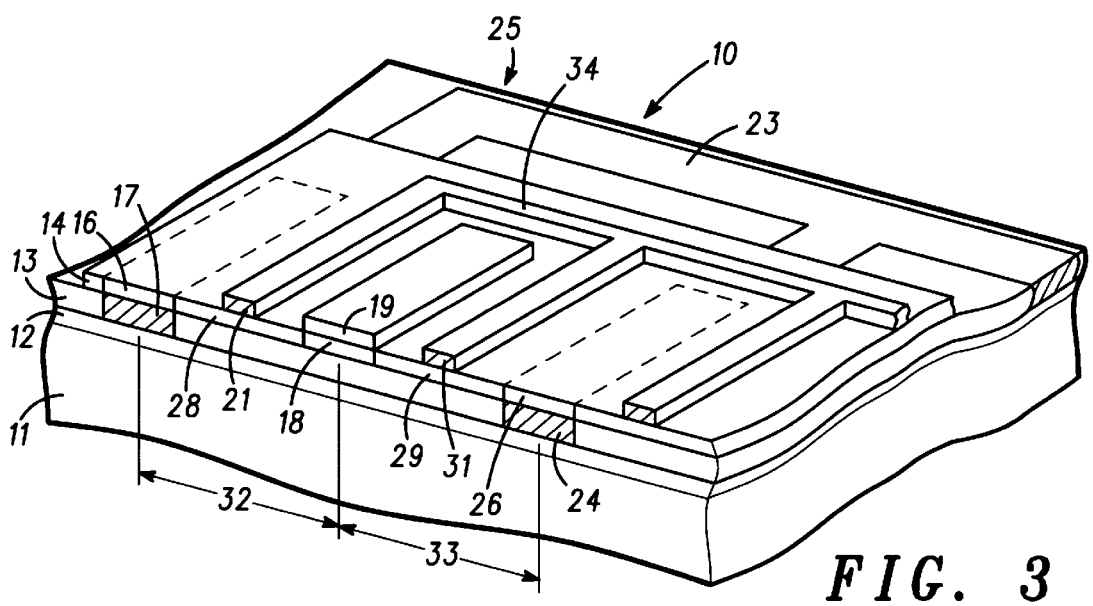
FIG. 3 schematically illustrates an isometric view of a portion of a silicon carbide transistor in accordance with the present invention.

FIG. 3 schematically illustrates an isometric view of a portion of a semiconductor device that includes a transistor 10 that utilizes film 14. The same reference numbers are used in FIGS. 2 and 3 to indicate similar elements. Film 14 is attached to a semiconductor substrate 11 that typically is a different type of semiconductor material from the material of film 14. In the preferred embodiment, substrate 11 is silicon. Substrate 11 could be other materials that are not single crystal silicon carbide including polycrystalline silicon carbide. These substrates also reduce the cost of manufacturing silicon carbide transistors. Film 14 is attached to substrate 11 through an adhesion layer 12. Typically, layer 12 is a thick, e.g. one micron, silicon dioxide layer. After adhering film 14, through the adhesion of layer 12, to substrate 11, adhesive layer 12 contacts dielectric layer 13 and conductor pattern layer 25 that were formed on film 14 Thereafter, film 14 is removed or cleaved from the remaining bulk 37 of substrate 40 by heating substrate 40 including layer 36. This method of cleaving thin films from bulk substrates is well known in the art as shown by the techniques in U.S. Pat. No. 5,374,564 issued to Bruel on Dec. 20, 1994 which is incorporated herein by reference.

Transistor 10 is formed in film 14 to have a plurality of transistor elements such as a first transistor element 32 and a second transistor element 33 that alternately share either a source or a drain area. Source areas or source regions 16 and 26, illustrated by dashed lines, and drain area or drain region 18 are formed by implanting dopants within film 14. Typically, drain region 18 and source regions 16 and 26 are approximately five to twenty microns wide in order to reduce series resistance and increase current density. Drain region 18 may or may not extend completely through film 14 because, unlike source regions 16 and 26, drain region 18 doesn't have to contact an underlying conductor. A channel region 28 is formed between and spaced apart from source region 16 and drain region 18, and a channel region 29 is formed between and spaced apart from drain region 18 and source region 26. Typically, channel regions 28 and 29 are approximately one to ten microns wide to achieve the desired breakdown voltage and operating frequency for transistor 10.

Gates 21 and 31 are formed as metal stripes between drain region 18 and source regions 16 and 26. Gates 21 and 31 are formed in a finger like structure that are interconnected by a conductor element 34. A drain electrode 19 is formed on drain region 18 to provided electrical contact thereto. Typically, transistor 10 has other drain electrodes that are connected together in a finger like structure, however, these are not shown in FIG. 3 for simplicity of the drawings and explanation.

In order to provide electrical contact to conductor pattern layer 25, a portion of film 14 is etched away to expose the underlying conductor 23. This allows forming electrical contact to source areas 16 and 26 via conductor 23. Consequently, conductor pattern layer 25 functions as a buried interconnect that provides electrical contact to transistor 10. In one embodiment, the material used to form conductor pattern layer 25 is a metal that is not etched by the processes used to remove the portions of silicon carbide film 14. Typically, a sulfur hexafluoride ($SF_6$) or other fluorine or chlorine plasma is utilized to remove silicon carbide. In such an embodiment, nickel or other metals such as titanium, chromium, or aluminum function as an etch stop, depending on the chemistry used, so that the etching may cease when conductor 23 is exposed. This also minimizes or prevents the etching of dielectric layer 13.

It should also be noted that the buried interconnect could be utilized for the drain or the gate instead of the source contact. Additionally, dopants could be implanted into film 14 before removing film 14 from silicon carbide substrate 40 instead of performing implants after attaching film 14 to substrate 11.

By now, it should be appreciated that there has been provided a novel silicon carbide transistor and method. Using a buried interconnect as a contact for the source eliminates the need to use an air bridge or a second level of metal interconnect for the source electrode. This results in reduced die size and also reduces manufacturing costs. The direct contact also improves frequency performance by minimizing source impedance.

We claim:

1. A method of forming a semiconductor device comprising:
   providing a single crystal silicon carbide bulk substrate;
   forming a conductor pattern on a surface of the single crystal silicon carbide bulk substrate;
   forming a dielectric layer on the surface of the single crystal silicon carbide bulk substrate to form a planar surface with the conductor pattern;
   removing a film of the silicon carbide from the single crystal silicon carbide bulk substrate wherein the film of the silicon carbide has the conductor pattern and the dielectric layer formed thereon;
   providing a semiconductor substrate that is a semiconductor material other than single crystal silicon carbide; and
   attaching the film of the silicon carbide to the semiconductor substrate wherein the conductor pattern and the dielectric layer are on a surface of the silicon carbide film that faces the semiconductor substrate.

2. The method of claim 1 further including forming a gate electrode and a drain contact on a surface of the film of the silicon carbide that faces opposite to the semiconductor substrate.

3. The method of claim 1 further including forming source and drain regions in the film of the silicon carbide wherein the source region overlies a portion of the conductor pattern.

* * * * *